(12) United States Patent
McClelland, II et al.

(10) Patent No.: US 6,754,074 B2
(45) Date of Patent: Jun. 22, 2004

(54) MULTIPURPOSE SERVER HANDLE

(75) Inventors: Belgie B. McClelland, II, Houston, TX (US); Scott R. Gant, Houston, TX (US); Daniel T. Thompson, Houston, TX (US); Erik R. Nielsen, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/238,010

(22) Filed: Sep. 9, 2002

(65) Prior Publication Data

US 2004/0047128 A1 Mar. 11, 2004

(51) Int. Cl.⁷ ............................................... H05H 7/20
(52) U.S. Cl. ...................... 361/690; 361/725; 361/726; 361/727; 361/754; 361/755
(58) Field of Search ................................. 361/690, 687, 361/694–695, 724–727, 746–747, 754–756, 798, 801–803

(56) References Cited

U.S. PATENT DOCUMENTS

| 5,642,258 A | 6/1997 | Barrus et al. ................ 361/683 |
| 5,684,674 A | * 11/1997 | Yin .............................. 361/695 |
| 5,721,668 A | 2/1998 | Barrus et al. ................ 361/683 |
| 5,791,753 A | 8/1998 | Paquin ..................... 312/332.1 |
| 6,134,115 A | * 10/2000 | Sim et al. .................... 361/747 |
| 6,247,944 B1 | 6/2001 | Bolognia et al. ............ 439/157 |
| 6,302,714 B1 | 10/2001 | Bolognia et al. ............ 439/157 |
| 6,490,153 B1 | * 12/2002 | Casebolt et al. ............ 361/724 |

OTHER PUBLICATIONS

Belgie B. McClelland, II et al., *Handle For A Server Blade*; Design Patent Application Ser. No. 29/164,569, filed Jul. 26, 2002 (6p.).
Belgie B. McClelland, II et al., *Server Blade*; Design Patent Application Ser. No. 29/164,607, filed Jul. 26, 2002 (7 p.).
Belgie B. McClelland, II et al., *Enclosure For Server Blades*; Design Patent Application Ser. No. 29/164,606, filed Jul. 26, 2002 (7 p.).

* cited by examiner

Primary Examiner—Gregory Thompson

(57) ABSTRACT

A server, or other electronic device, includes a handle mated with the server. The server slides into and mates with a chassis. The handle is formed to provide a central opening through which visual and physical access is provided to a portion of the server, and preferably a portion of the server on which user interactive components are provided. Such components may one or more include status indicators, one or more user activated controls and one or more connectors. The opening permits the user to see the status indicators, which may comprise LEDs, activate the controls and connect an external cable to the server. The handle also is mated to the server via a hinge and a locking mechanism. With the locking mechanism is disengaged, the handle pivots away from the server. The user can then grip and further pivot the handle and pull the server out of the chassis.

13 Claims, 4 Drawing Sheets

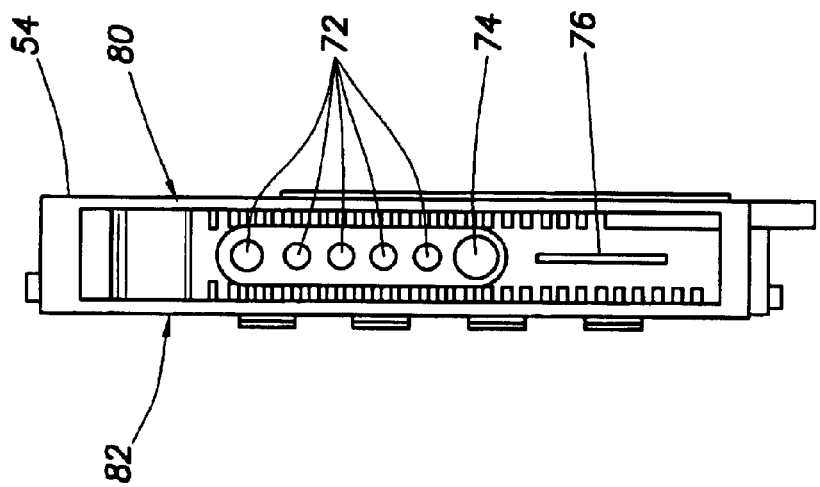
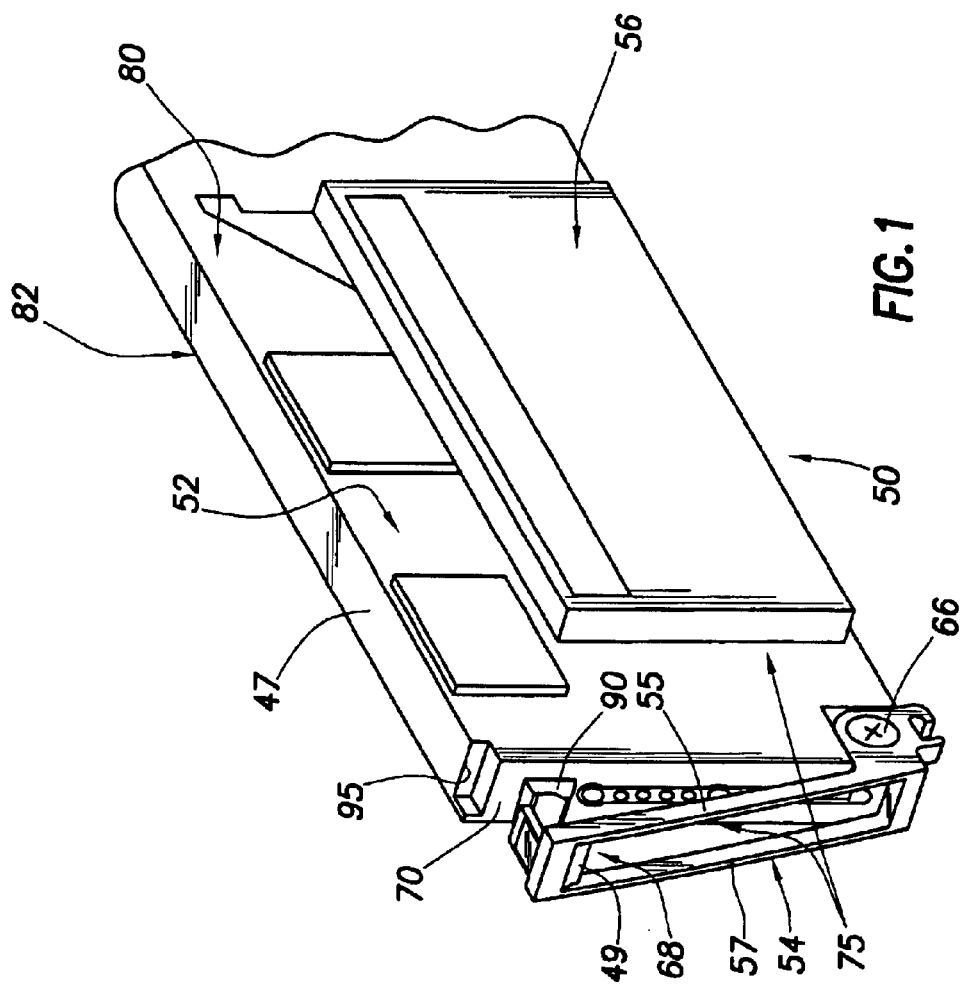

MULTIPURPOSE SERVER HANDLE

CROSS-REFERENCE TO RELATED APPLICATIONS

Not applicable

STATEMENT REGARDING FEDERALLY SPONSORED RESEARCH OR DEVELOPMENT

Not applicable

BACKGROUND OF THE INVENTION

1. Field of the Invention

The present invention generally relates to a multipurpose handle for a chassis mounted, electronic device. More particularly, the invention relates to a handle for a chassis mounted server. Still more particularly, the invention relates to a server handle which permits a path for airflow to cool the server, permits easy viewing and access to status indicators and controls on the server and provides a mechanism for single-handed ejection and insertion into a chassis.

2. Background of the Invention

Many types of electronic devices are fabricated in a form to be inserted into chassis. For example, server computers are often provided in the form of a single circuit card on which the server's electronics (processor, memory, storage devices, etc.) are mounted. Such a server can then be mounted in a chassis which may accommodate a plurality of servers. Each server, for example, can be slid into the chassis in a vertical orientation. The chassis can then be mounted in a rack containing multiple such chassis and other components such as power supplies, network attached storage devices, etc. This disclosure uses the example of servers, but is not limited to such devices.

In a chassis server system as that described above, several issues must be considered. As electronics have become smaller and smaller, the density of servers in a rack has increased. In general, it is desirable to provide the ability to have as many servers as possible in a chassis and thus in the rack. This desire creates an incentive for system architects to design such systems so that the servers are located as close together as possible thereby increasing the density of the servers in a given volume. Providing a chassis which contain closely spaced servers creates several design problems.

One problem is that the closely spaced servers must be adequately cooled, but there may be little space for air to be drawn over the server's electronics. In addition, it may be desirable to provide status indicators, controls and/or connectors on the exposed exterior surface of chassis mounted servers. Yet, at the same time, a handle or other mechanism of some sort must be provided on or around the exposed exterior surface to permit the server to be removed from or inserted into the chassis. Thus, a problem exists as to how to provide the necessary insertion/extraction mechanism in an area of the server that also includes status indicators, controls and connectors which must be accessible and usable by a person, all in a fairly confined space. Accordingly, a solution to these problems is needed. To date, no such solution is known to exist.

BRIEF SUMMARY OF THE INVENTION

The problems noted above are solved in large part by a handle adapted to be mated with an electronics device, such as a server that slides into and mates with a chassis. The handle is formed to provide a central opening through which visual and physical access is provided to a portion of the server, and preferably a portion of the server on which user interactive components are provided. Such components may include one or more status indicators, one or more user activated controls and/or one or more connectors. The opening permits the user to see the status indicators, which may comprise LEDs, activate the controls and/or connect an external cable to the server. The handle also is mated to the server via a hinge and a locking mechanism. When the locking mechanism is disengaged, the handle pivots away from the server. The user can then grip and further pivot the handle and pull the server out of the chassis.

If desired, the handle may include a pair of opposing cam surfaces to facilitate insertion into and removal from the chassis. The cam surfaces engage a lip on the front edge of the chassis to act as a leverage point when pivoting out or rotating back the handle.

Further still, air can be sucked in or blown through the opening in the handle for cooling purposes. Thus, a fan in the chassis preferably causes air to be drawn in from the front of the server, through the opening in the handle and around one or both sides of the servers's printed circuit board.

These features of the handle thus permit a low profile server to be provided which addresses a number of significant design issues thereby permitting a high density of servers to be accommodated in a chassis. These and other benefits will be discovered upon reviewing the following description.

BRIEF DESCRIPTION OF THE DRAWINGS

For a detailed description of the preferred embodiments of the invention, reference will now be made to the accompanying drawings in which:

FIG. 1 shows a perspective view of a server having a multipurpose handle in an unlocked position in accordance with a preferred embodiment of the invention;

FIG. 4 shows a front view of the server illustrating that user interactive components on the server can be seen and accessed through an opening in the handle;

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct electrical connection. Thus, if a first device couples to a second device, that connection may be through a direct electrical connection, or through an indirect electrical connection via other devices and connections.

DETAILED DESCRIPTION OF THE PREFERRED EMBODIMENTS

Figure 2:
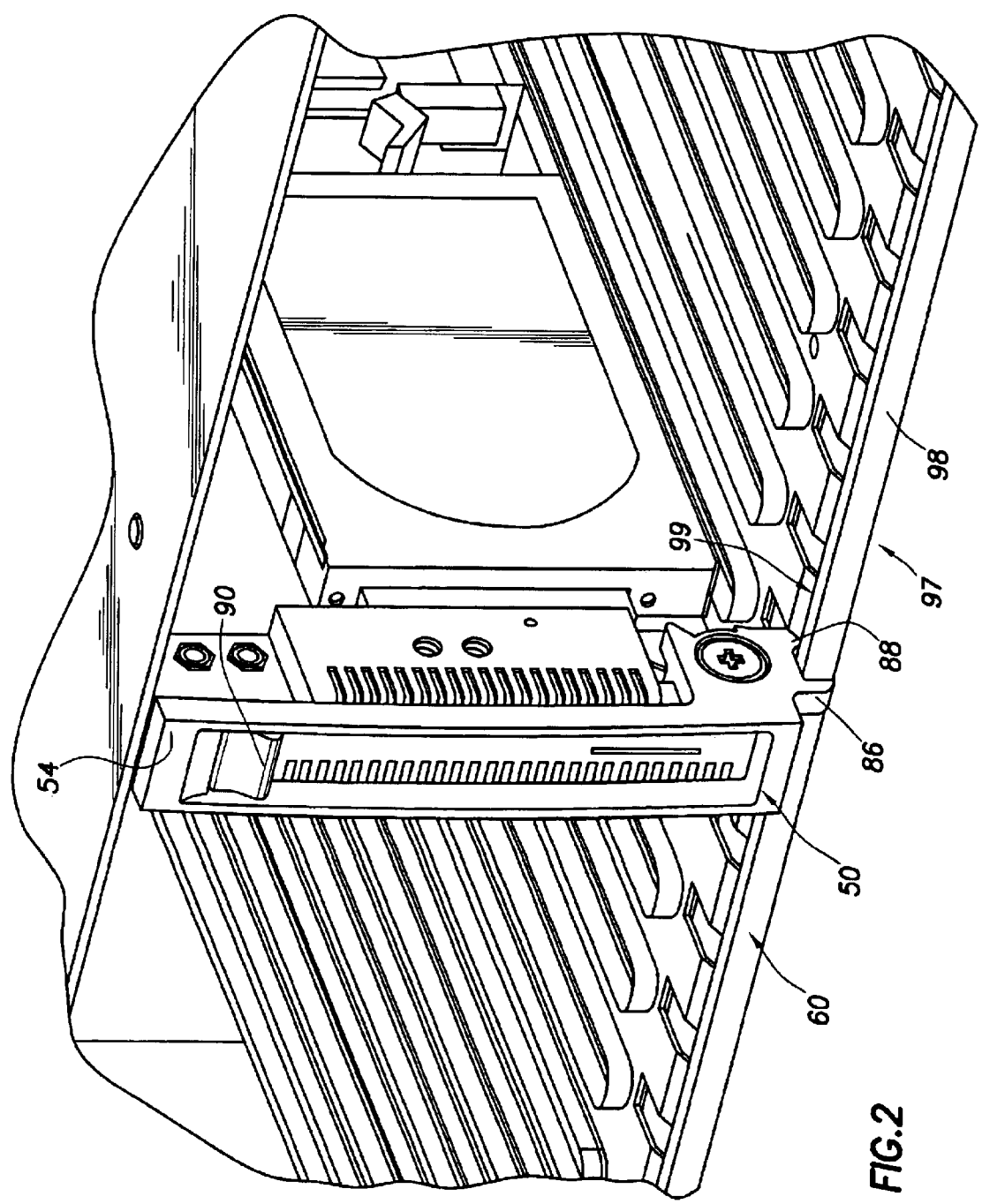
FIG. 2 shows a front portion of a chassis in which a server has been mated.

Referring now to FIG. 1, a server or other electronic device 50 is shown in accordance with the preferred embodiment of the invention. Server 50 generally comprises server electronics 56 mounted on a printed circuit board 52 and a multipurpose handle 54. As shown in FIG. 2, server 50 can be inserted into a chassis 60 along guide slots 62 formed between adjacent pairs of guide rails 64. Chassis 60 preferably includes a plurality of guide slots 62 into which a like number of servers 50 can be inserted, such as the server 50 shown in FIG. 2 that is installed in the chassis.

Figure 3:
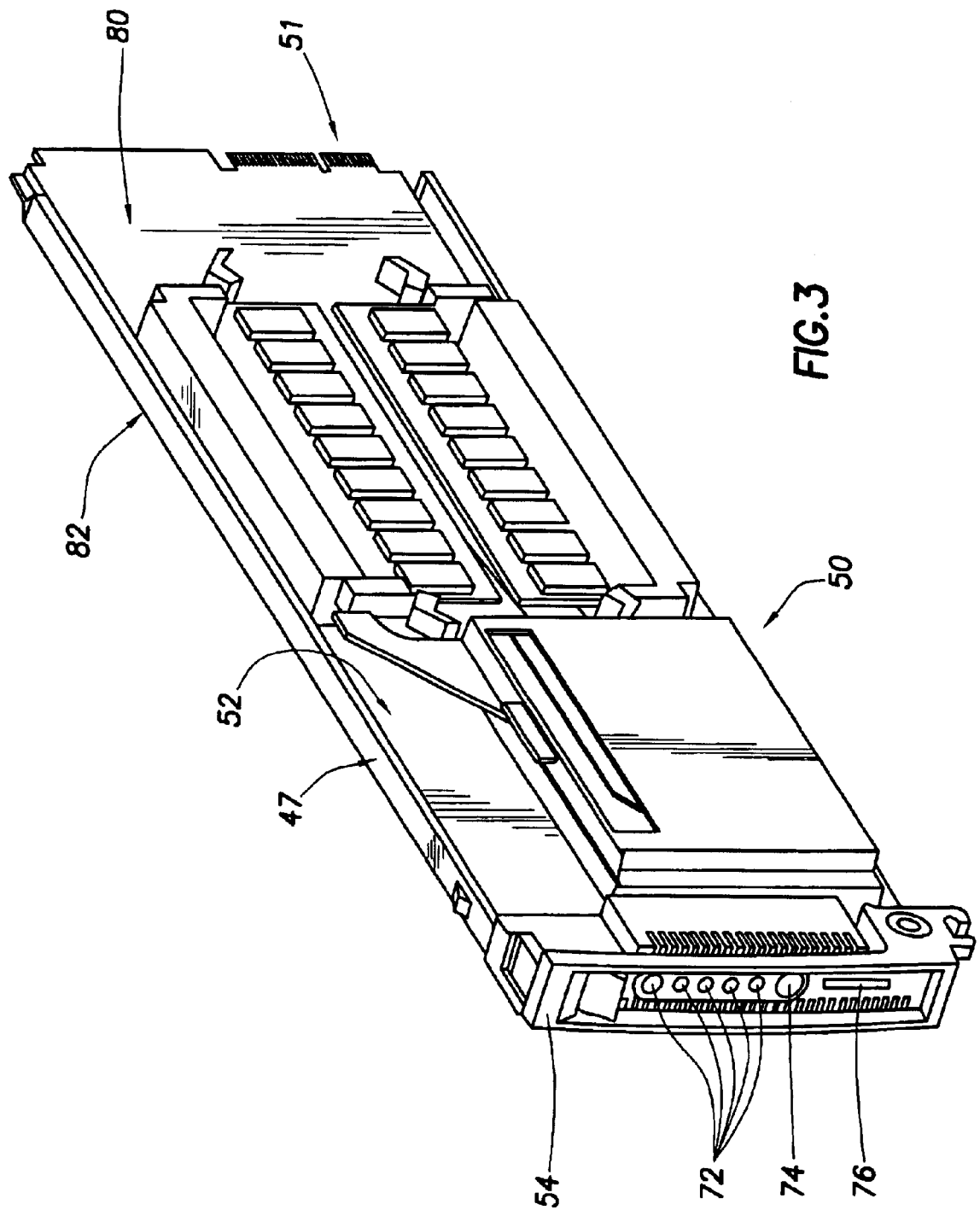
FIG. 3 shows another perspective of the server of FIG. 1 with the handle in a locked position.

As shown in FIG. 1, the multipurpose handle 54 preferably is mated with a server tray 47 via a hinge 66, which in the preferred embodiment comprises a pin or threaded member that passes through corresponding holes in the handle 54 and tray 47. FIG. 1 shows the server 50 with its handle 54 swiveled out away form the board. FIG. 3 shows the server 50 with the handle in the closed location. As can be seen in FIG. 1 and 3, and in the front view of FIG. 4, the multipurpose handle 54 preferably is formed from a material (e.g. metal) that defines a central opening 68. Opening 60 serves one or both of the following functions. Opening 68 permits the front edge 70 of the server and/or tray 47 to be visually accessed through the handle 54. As shown best in FIGS. 3 and 4, the front edge 70 of the server includes one or more user interactive components which comprise any or more of the following: one or more status indicators 72, power button 74, and connector 76, in accordance with a preferred embodiment of the invention. The status indicators 72 may comprise light emitting diodes ("LEDs") and include a power LED, communication activity LED, error LED, and the like. The power button 74 is depressed to turn the server 50 on and off. The electrical connector 76 can be used to connect a work station or other type of electronic device for configuring or monitoring the status of the server. Opening 68 also provides physical access to button 74 and connector 76. The particular configuration of status lights 72, power button 74 and connector 76 is exemplary of only one of numerous configurations of user interactive components which may be present on the front surface of the server. Not any one of the status indicators, power button or connector is required, and thus the user interactive components can be implement in any desired combination. Preferably, however, at least one user interactive component is present on the front edge 70 of the server 50 to which visual and/or physical (a finger or electrical cable) access through the opening 68 in the handle 64 is facilitated.

Another function provided by the multipurpose handle 54 is to facilitate thermal cooling of the server. In accordance with a preferred embodiment of the invention, the server 50 is cooled by having air move preferably across opposite sides 80 and 82 of the board 52. A fan generally located in the chassis at the rear of the server opposite the handle 54 can be included to draw air from the handle end of the server over opposing sides 80, 82 and out the back of the chassis. Because of the desirably high server density in the chassis, there is little space on or around the individual servers for air to be drawn in. To facilitate the entry of air into the chassis, the handle 54, when in the closed position as in FIG. 3, permits air to be sucked in through opening 68. As shown in FIG. 1, air flow 75 is permitted through opening 68 and around opposing sides 80 and 82. Preferably, the side members 55 and 57 of the handle permit enough of a space between the side members 55, 57 and the tray 47 to permit a sufficient volume of air to pass for thermally cooling the server's electronics. As such, when the handle 54 is in the closed position, sides 55 and 57 preferably do not touch tray 47 along their entire lengths.

Figure 6:
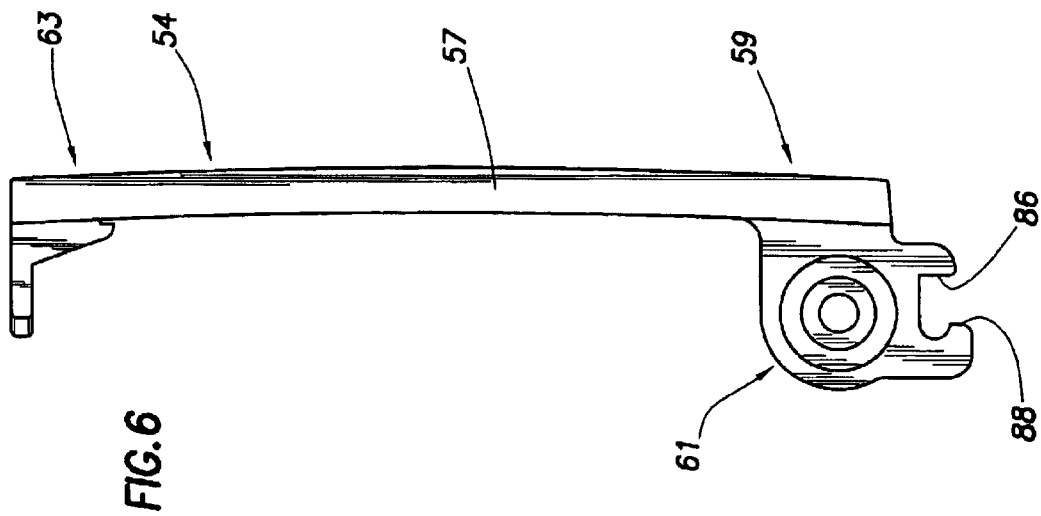
FIG. 6 shows a side view of the multipurpose handle.
Figure 5:
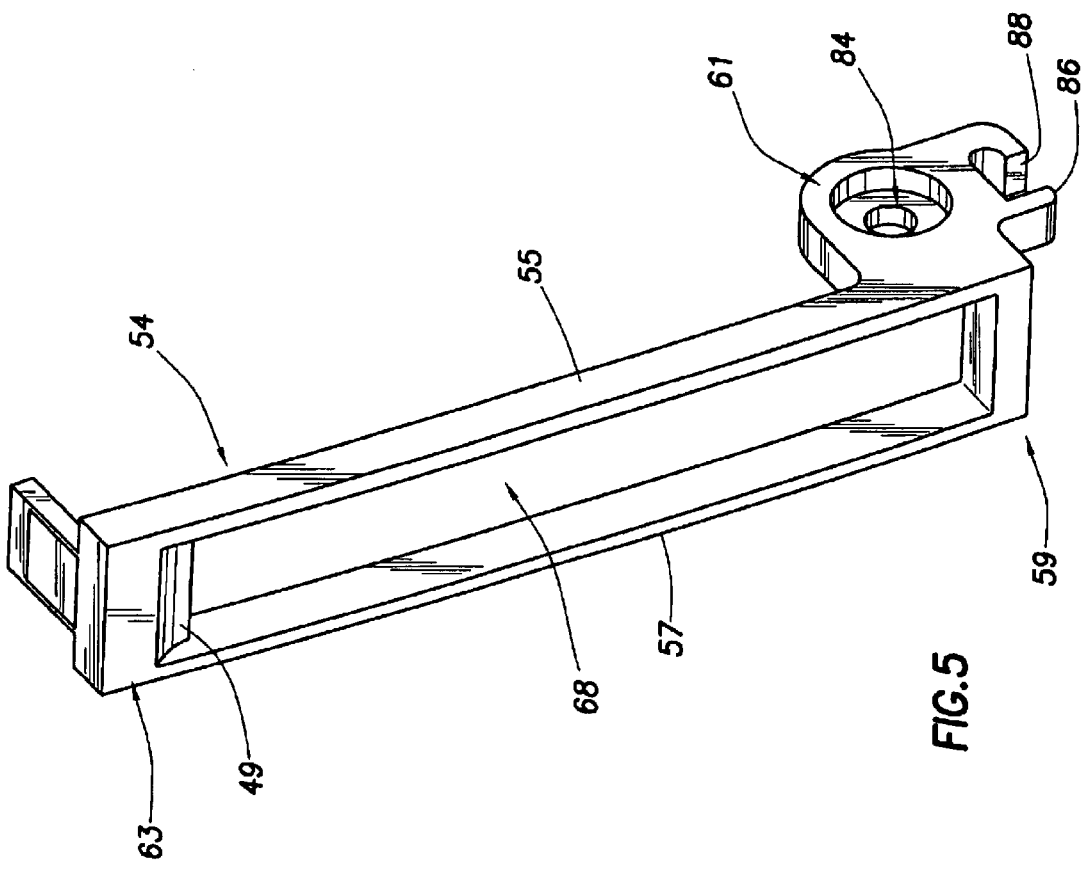
FIG. 5 shows a perspective view of a multipurpose handle in accordance with the preferred embodiment.

FIGS. 5 and 6 show dose up views of the multipurpose handle 54 FIG. 5 contains a perspective view and FIG. 6 contains a side view. The handle 54 generally is formed from a single piece of material such as a metal or durable plastic or composite. Alternatively, the handle can be fabricated from a plurality of components glued, welded or otherwise attached together. As is shown the handle is generally rectangular with sides 55 and 57 that define opening 68 through which access can be made to the server as discussed above. The lower end 59 of the handle preferably includes a protruding member 61 which defines a hole 84 through which a hinge can be inserted. Member 61 also defines two cam surfaces 86 and 88 which facilitate single-handed insertion and removal of the server 50 as will be discussed below. Finally, upper end 83 of the handle 54 includes a surface 49 which locks against locking mechanism 90 (FIG. 2) to permit the handle to be unlocked from tray 47 and the handle pivoted out to permit a use to grip the handle and remove the server. Referring briefly to FIG. 1, locking mechanism 90 engages a corresponding locking surface 49 formed on the server's handle 54. As shown in FIGS. 1 and 2, locking mechanism 90 preferably comprises a single piece component adapted to fit at the upper end 95 of the server tray 47 thereby exposing a portion of the locking mechanism through opening 68 and another portion at the top of the handle. The portion of the locking mechanism 90 exposed through the opening 88 is the portion that a user depresses to disengage the locking mechanism from the handle 54.

Cam surfaces 86 and 88 will now be discussed with reference to FIGS. 1 and 2. Cam surface 86 facilitates server removal and cam surface 88 facilitates server insertion. As shown in FIG. 2, chassis 60 includes a front lip 97 that has an outer surface 98 and an inner surface 99. Once inserted into chassis 60, opposing cam surfaces 86 and 88 straddle front lip 97 as shown. The server 50 can be removed by disengaging the locking mechanism 90 as explained above. Once disengaged, the handle 54 pivots out and away from the server as best shown in FIG. 1. Referring again to FIG. 2, pivoting handle 54 away from chassis 60 causes cam surface 86 to engage outer surface 98 of front lip 97. The engagement of these two surfaces 86 and 98 creates a leverage point about which further pivoting the handle 54 will cause the server 50 to be forced outward. As shown in FIG. 3, a blind mating connector 51 at the rear of the server will disengage from a corresponding socket (not shown) in the chassis and once this happens, the server can easily be slid out from its guide slot 62.

To insert a server 50, the server is first slid partially into place in a guide slot 62 with the handle 54 generally in an outward pivoting position (FIG. 1). With the handle 54 pivoted outward, cam surface 68 can be slid over front lip 97. Once cam surface 88 is on the backside of lip 97, the handle is then rotated toward a locked position with the server 50. As the handle 54 is continued to be rotated toward its locked position, the cam surface 88 will engage inner surface 99 of lip 97 which then causes server 50 to be further pushed or pulled back along the guide channel 62. The engagement of these two surfaces 86 and 88 creates a leverage point about which further pivoting back of the handle 54 will cause in the server'blind mating connector to mate with the corresponding socket in the chasis 60, thereby fully seating server 50 in place in the chassis. Cam surfaces 86 and 88 and handle 54 provide a single-handed insertion and removal capability. Also, the handle 54 is locked into place by locking mechanism 90.

The preferred embodiment discussed above includes a multipurpose handle for a server which mates with a chassis. The functions performed by the handle include providing a gripping surface for insertion and removal of the server, visual and physical access to user interactive devices on the front surface of the server behind the handle, and providing a passageway for air to flow around the server's electronics for cooling purposes.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An electronic device, comprising:
    a tray containing a circuit board on which electronics are mounted, said tray having a front edge; and
    a handle connected to said tray by way of a hinge, said handle comprising outer edges that define an opening which provides visual and physical access to said front edge, wherein said front edge includes user interactive components to which a user can interact through said opening in said handle.

2. The electronic device of claim 1, wherein said user interactive components comprise a component selected from the group consisting of status indicators, buttons and connectors.

3. The electronic device of claim 1, wherein said user interactive components comprise at least one status indicator and at least one button.

4. The electronic device of claim 1, wherein said outer edges of sold handle permit air to flow through said opening and around said circuit board to cool said electronics.

5. The electronic device of claim 1, wherein said handle includes a pair of opposing cam surfaces adapted to engage opposite sides of a lip of a chassis in which said electronic device can be inserted, said cam surfaces adapted to facilitate insertion into and removal from said chassis.

6. An electronic system, comprising:
    a chassis into which a plurality of removable electronic devices are inserted; wherein at least one removable electronic device comprises:
        a tray containing a circuit board on which electronics are mounted, said tray having a front edge; and
        a handle connected to said tray by way of a hinge, said handle comprising outer edges that define an opening which provides visual and physical access to said front edge; wherein said front edge includes user interactive components to which a user can interact through said opening in said handle.

7. The electronic system of claim 6 wherein said user interactive components comprise a component selected from the group consisting of status indicators buttons and connectors.

8. The electronic system of claim 6 wherein said user interactive components comprise at least one status indicator and at least one button.

9. The electronic system of claim 6 wherein said outer edges of said handle permit air to flow through said opening and around said circuit board to cool said electronics.

10. The electronic system of claim 6 wherein said handle includes a pair of opposing cam surfaces adapted to engage opposite sides of a lip of said chassis in which said electronic device can be inserted, said cam surfaces adapted to facilitate insertion into and removal from said chassis.

11. The electronic system of claim 6 wherein said electronic device comprises a server.

12. An electronic device, comprising:
    a tray containing a circuit board on which electronics are mounted, said tray having a front edge including user interactive components; and
    means for inserting and removing said tray from a chassis, wherein said means for inserting and removing includes means for providing visual and physical access to said front edge and said user interactive components.

13. An electronic system, comprising:
    a chassis into which a plurality of removable electronic devices are inserted;
    wherein at least one removable electronic device comprises:
        a tray containing a circuit board on which electronics are mounted, said tray having a front edge including user interactive components; and
        means for inserting and removing said electronic device from a chasis and for providing visual and physical access to said front edge and said user interactive components.

* * * * *